(12) United States Patent
Jang et al.

(10) Patent No.: US 7,294,908 B2
(45) Date of Patent: Nov. 13, 2007

(54) METHOD OF FORMING A GATE PATTERN IN A SEMICONDUCTOR DEVICE

(75) Inventors: Jeong-Yel Jang, Chungcheongbuk-do (KR); Sung-Ho Kwak, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 150 days.

(21) Appl. No.: 11/292,764

(22) Filed: Dec. 2, 2005

(65) Prior Publication Data

US 2006/0128084 A1    Jun. 15, 2006

(30) Foreign Application Priority Data

Dec. 15, 2004    (KR) .................. 10-2004-0106152

(51) Int. Cl.
*H01L 29/06* (2006.01)
*H01L 21/302* (2006.01)
*H01L 21/461* (2006.01)

(52) U.S. Cl. ..................... 257/623; 438/737
(58) Field of Classification Search ............... 257/623; 438/708, 712, 735, 736, 737
See application file for complete search history.

(56) References Cited

U.S. PATENT DOCUMENTS

| | | | |
|---|---|---|---|
| 6,524,964 B2* | 2/2003 | Yu | 438/736 |
| 2004/0009436 A1* | 1/2004 | Lee et al. | 430/313 |
| 2004/0127015 A1* | 7/2004 | Lee | 438/629 |
| 2004/0198065 A1* | 10/2004 | Lee et al. | 438/725 |
| 2004/0242014 A1* | 12/2004 | Chakihara et al. | 438/737 |
| 2006/0124587 A1* | 6/2006 | Lee | 216/47 |
| 2007/0049040 A1* | 3/2007 | Bai et al. | 438/712 |

* cited by examiner

Primary Examiner—David W. Coleman
(74) Attorney, Agent, or Firm—Andrew D. Fortney

(57) ABSTRACT

A gate pattern having a critical dimension after an etching process of 60-70nm may be formed using an ArF photoresist as an etching mask by a method including sequentially forming a gate oxide layer, a gate electrode layer, an anti-reflection coating layer, and an ArF photoresist layer on a semiconductor wafer; forming a photoresist pattern by exposing and developing the ArF photoresist layer; etching the anti-reflection coating layer using the photoresist pattern as an etching mask; removing an oxide layer formed during etching of the anti-reflection coating layer; etching the gate electrode layer; and over-etching a remaining gate electrode layer.

20 Claims, 4 Drawing Sheets

METHOD OF FORMING A GATE PATTERN IN A SEMICONDUCTOR DEVICE

CROSS-REFERENCE TO RELATED APPLICATION

This application claims priority to and the benefit of Korean Patent Application No. 10-2004-0106152, filed in the Korean Intellectual Property Office on Dec. 15, 2004, the entire contents of which are incorporated herein by reference.

BACKGROUND OF THE INVENTION (a) Field of the Invention

The present invention relates to a method of manufacturing a semiconductor device. More particularly, the present invention relates to a method of forming a gate pattern having a small critical dimension using an ArF photoresist as an etching mask.

(b) Description of the Related Art

As semiconductor devices become smaller, faster and more integrated, photolithography and etching processes become more critical in fine patterning of the devices. The photolithography and etching processes typically comprise forming a photoresist pattern and selectively removing portions of a target layer thereunder using the photoresist pattern as an etching mask so as to form a predetermined pattern in the target layer, for example a gate electrode pattern. The photoresist pattern is generally formed by a sequential process including coating a photoresist on a layer to be etched, exposing the photoresist by passing light of a certain wavelength or wavelength band through an exposure mask, and removing the exposed (or unexposed) photoresist with a solvent.

A critical dimension (CD) obtained by the photolithography process depends on the wavelength of a light source in the exposure process. For example, a light source with a shorter wavelength may be beneficial for a patterning a photoresist layer of a finer line width.

Conventionally, a KrF light source is used for forming a photoresist pattern, but patterning a fine line having a width narrower than 130 nm is difficult when using the KrF light source. Therefore, an ArF light source that has a narrower wavelength and a higher resolution than the KrF light source has recently been used for the exposure process. In addition, a photoresist material having a high resolution with the ArF light source, that is, an ArF photoresist, has been used for the exposure process.

In a photolithography process using the ArF exposure light source, a bottom anti-reflection coating (BARC) for preventing a diffused reflection is firstly formed on a target layer such as a gate electrode layer. Thereafter, an ArF photoresist is coated on the BARC, and the ArF photoresist is exposed to light from an ArF light source passed through a reticle and developed so as to form a photoresist pattern. In addition, after the target layer is etched using the photoresist pattern as an etching mask, the photoresist pattern is removed.

However, there are some difficulties even if the ArF photoresist is used, that will be described hereinafter.

In etching a polysilicon layer, the photoresist pattern linewidth should be narrower than 80 nm for forming a gate pattern having a design rule (or critical dimension) of 65 nm. In this case, as an aspect ratio of the photoresist pattern increases, the photoresist pattern may easily collapse, and the line edge roughness may increase, so that a process window for a depth of focus (DOF) decreases.

In addition, in patterning a gate pattern having a critical dimension (after etching) of about 65 nm using an ArF photoresist, the wavelength of light from the ArF light source is shorter than that from the KrF light source, so that a thickness (2000-2700 Å) of the ArF photoresist should be smaller than a thickness (3000-3500 Å) of the KrF photoresist. Moreover, the ArF photoresist has a hardness that is lower than that of the KrF photoresist, so that the photoresist pattern may be easily distorted by plasma generated in an etching process. As a result, the difficulties in using the ArF photoresist may cause a pattern failure.

In order to overcome those difficulties, an etching process condition where a difference between a critical dimension (CD) before an etching process and a CD after the etching process can be 30-40 nm should be developed, but this has not been satisfactorily proposed.

The above information disclosed in this Background section is only for enhancement of understanding of the background of the invention. Therefore, it may contain information that does not form prior art or other knowledge that is already known in this or any other country to a person of ordinary skill in the art.

SUMMARY OF THE INVENTION

The present invention has been made in an effort to provide a method of forming a gate pattern in a semiconductor device having advantages of providing a gate pattern with a critical dimension after etching of 60-70 nm when an ArF photoresist is used as an etching mask.

An exemplary method of forming a gate pattern in a semiconductor device according to an embodiment of the present invention includes sequentially forming a gate oxide layer, a gate electrode layer, an anti-reflection coating layer, and an ArF photoresist layer on a semiconductor wafer; forming a photoresist pattern by exposing and developing the ArF photoresist layer; etching the anti-reflection coating layer using the photoresist pattern as an etching mask; removing an oxide layer formed during etching of the anti-reflection coating layer; etching the gate electrode layer; and over-etching a remaining gate electrode layer.

In a further embodiment, inductively coupled plasma (ICP) may be used for etching the anti-reflection coating layer, removing an oxide layer formed during etching the anti-reflection coating layer, etching the gate electrode layer, and over-etching a remaining gate electrode layer.

Etching the anti-reflection coating layer may comprise flowing an etching gas comprising $CF_4$ and $O_2$ at a rate of 80-130 sccm, and maintaining an etching chamber pressure at 1-10 mTorr, a source power at 200-500 W, and a bias power at 10-70 W. In one embodiment, an additional over-etching step is performed after detecting an end-point of etching the anti-reflection coating layer.

Removing the oxide layer may comprise flowing an etching gas comprising $CF_4$ at a rate of 40-60 sccm, for a process time of 5-10 sec, at an etching chamber pressure of 1-7 mTorr, a source power of 300-700 W, and a bias power of 20-70 W.

Etching the gate electrode layer, may comprise flowing an etching gas comprising $Cl_2$, HBr, and $O_2$ at 10-50 sccm, 100-180 sccm and 0-5 sccm, respectively, for a process time of 30-50 sec, at an etching chamber pressure of 1-7 mTorr, a source power of 300-800 W, and a bias power of 50-100 W.

Over-etching the remaining gate electrode layer may comprise flowing an etching gas comprising $N_2$, HBr, and $O_2$ at 1-5 sccm, 5-15 sccm and 130-170 sccm, respectively, for a process time of 100-140 sec, at an etching chamber pressure of 50-100 mTorr, a source power of 700-1500 W; and a bias power of 50-200 W.

In addition, the gate oxide layer may have a thickness of 10-20 Å, the gate electrode layer may have a thickness of 1500-1800 Å, the anti-reflection coating layer may have a thickness of 300-400 Å, and the ArF photoresist layer may have a thickness of 2000-2700 Å.

According to such a configuration, a gate pattern having a critical dimension after etching is 60-70 nm can be formed by using a photoresist pattern having a critical dimension before etching of 100-110 nm.

DETAILED DESCRIPTION OF THE EMBODIMENTS

An exemplary embodiment of the present invention will hereinafter be described in detail with reference to the accompanying drawings.

FIG. 1A to FIG. 1E are cross-sectional views showing a method of forming a gate pattern according to an exemplary embodiment of the present invention.

Figure 1A:
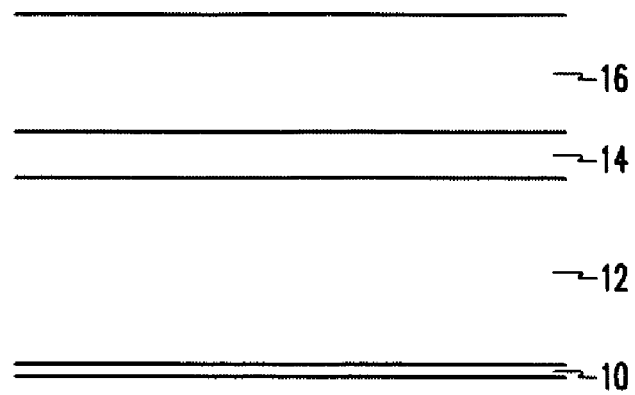
FIG. 1A to FIG. 1E are cross-sectional views showing a method of forming a gate pattern according to an exemplary embodiment of the present invention.

Referring to FIG. 1A, a gate oxide layer 10, a polysilicon layer 12 as a gate electrode layer, an anti-reflection coating 14, and an ArF photoresist layer 16 are sequentially formed on a semiconductor wafer. The gate oxide layer may have a thickness of 10-20 Å, the gate electrode layer may have a thickness of 1500-1800 Å, the anti-reflection coating layer may have a thickness of 300-400 Å, and/or the ArF photoresist layer may have a thickness of 2000-2700 Å.

Subsequently, a photoresist pattern 16' is formed by exposing photoresist layer 16 to light passed through a reticle or photomask using ArF as a light source and developing the exposed photoresist layer 16. A critical dimension of the photoresist pattern 16' (after development) may be 100-110 nm.

The semiconductor wafer is then loaded into an etching chamber, and an inductive coupled plasma (ICP) etching method is applied thereto.

In the ICP method, reaction gases flow into an upper part of the etching chamber and are then converted into a plasma by a source (RF) power applied to a plasma source coil, so as to etch a target layer on the semiconductor wafer under the photoresist pattern 16'. In the present exemplary embodiment, an etching process condition may be optimized so that an initial or develop inspection critical dimension (DICD) of the photoresist pattern 16' can be larger by 30-40 nm than a final inspection critical dimension (FICD) of the gate pattern, and the photoresist pattern can remain after the etching process.

In more detail, after the semiconductor wafer is loaded into the etching chamber, the anti-reflection coating layer is etched using the photoresist pattern 16' as an etching mask. Reference numeral 14' denotes a pattern of the anti-reflection coating layer after being etched.

1. In etching the anti-reflection coating layer, an etching gas comprising a fluorocarbon such as $CF_4$ may flow into the etching chamber at a rate of 30-50 sccm and an oxygen source such as $O_2$ may flow into the etching chamber at a rate of 50-80 sccm. Thus, the total flow of etching gases for etching the anti-reflection coating layer may be from 80 to 130 sccm. The etching chamber pressure may be maintained at a level of 1-10 mTorr, the source power may be maintained at 200-500 W, and/or the bias power maintained at 10-70 W. In addition, after detecting an end-point of etching the anti-reflection coating layer, an additional over-etching of the anti-reflection coating layer (up to 100% more time than is taken to reach the endpoint, e.g., 50-100% more time) may be performed. Thus, etching the anti-reflection coating layer may further comprise flowing an etching gas comprising a fluorocarbon and an oxygen source at a rate of 80-130 sccm, and maintaining a chamber pressure of 0.5-25 mTorr, a source power of 100-1000 W, and a bias power of 5-100 W. In addition, the method may further comprise detecting an end-point of etching the anti-reflection coating layer, and over-etching the remaining anti-reflection coating layer.

Figure 1B:
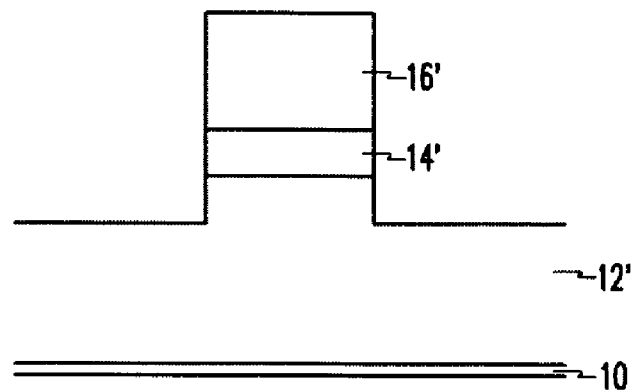

FIG. 1B shows a cross-sectional view of the gate pattern after completing the over-etching process of the anti-reflection coating layer, and reference numeral 12' denotes the gate electrode layer after the over-etching.

Figure 1C:
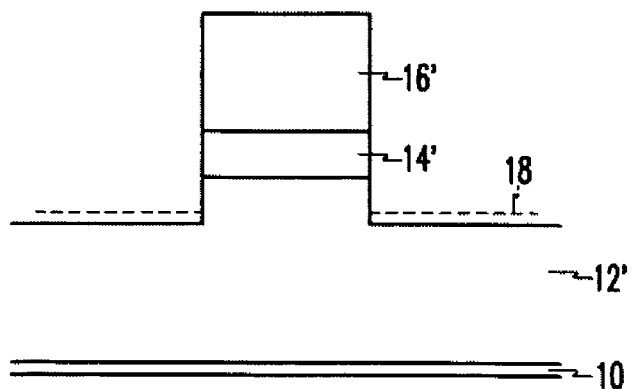

Subsequently, as shown in FIG. 1C, an oxide layer 18 that may be formed during etching of the anti-reflection coating layer is removed. In this process, an etching gas comprising a fluorocarbon such as $CF_4$ may be flowed at a rate, e.g., of 40-60 sccm, the process time may be 5-10 sec, the etching chamber pressure may be maintained at a level of 1-7 mTorr, the source power may be maintained at 300-700 W, and/or the bias power may be maintained at 20-70 W. However, removing the oxide layer may further comprise etching the structure resulting from etching the anti-reflection coating layer with a gas comprising a fluorocarbon (e.g., $CF_4$) having a flow rate of 20-100 sccm, for a time of 2-20 sec, and at a pressure of 0.5-10 mTorr, a source power of 100-1000 W, and/or a bias power of 10-100 W.

After removing the oxide layer 18, a main etching step where portions of the gate electrode layer 12' are selectively removed follows. In the main etching step, an etching gas comprising a chlorine source (e.g., $Cl_2$) is flowed at 10-50 sccm, a hydrogen halide (e.g., HBr) is flowed at 100-180 sccm, and an oxygen source (e.g., $O_2$) is flowed at 0-5 sccm; the process time is 30-50 sec; the etching chamber pressure may be maintained at a level of 1-7 mTorr; the source power may be maintained at 300-800 W; and the bias power may be maintained at 50-100 W. However, etching the gate electrode layer may comprises etching with a gas comprising a chlorine source, a hydrogen halide and (optionally) an oxygen source having a total flow rate of 100-250 sccm, for a time of 10-100 sec, and at a chamber pressure of 0.5-10 mTorr, a source power of 200-1000 W, and/or a bias power of 20-200 W.

Figure 1D:
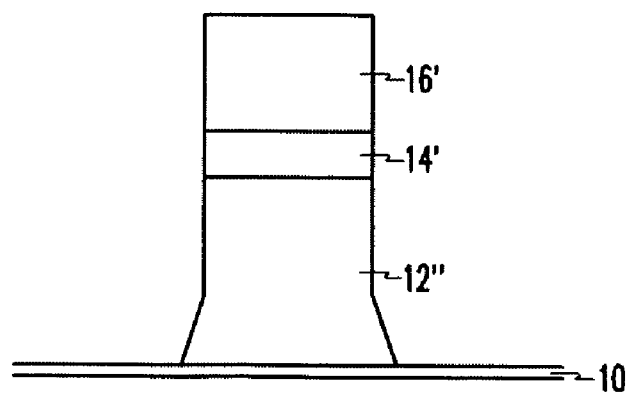

FIG. 1D shows a cross-sectional view of the gate pattern after the main etching step. Referring to FIG. 1D, after the main etching step, by-products from a lower layer (for example, so-called divots) may undesirably remain in the gate electrode layer pattern 12''.

Figure 1E:
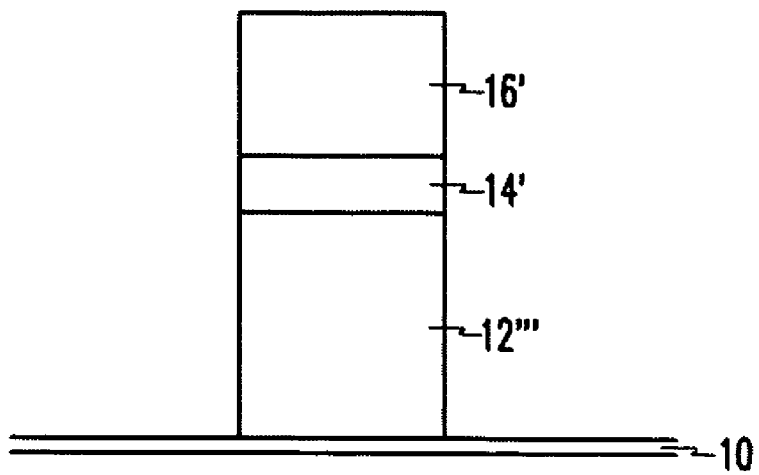

The remaining gate electrode layer (e.g., the gate pattern) is then subjected to an over-etching step. In the over-etching step, an etching gas comprising $N_2$ flowed at a rate of 5-15 sccm, HBr flowed at a rate of 130-170 sccm, and $O_2$ flowed at a rate of 1-5 sccm may be introduced to the etching chamber; the process time may be 100-140 sec; the etching chamber pressure may be maintained at a level of 50-100 mTorr; the source power may be maintained at 700-1500 W; and the bias power may be maintained at 50-200 W. However, over-etching the remaining gate electrode layer may comprise etching with a gas comprising a nitrogen source (such as $N_2$, $NH_3$ and/or $N_2O$), a hydrogen halide (such as HCl or HBr) and an oxygen source (such as $O_2$, $O_3$ and/or $N_2O$) having a total flow rate of 100-250 sccm, for a time of 60-240 sec, and at a pressure of 10-150 mTorr, a source power of 500-2500 W, and/or a bias power of 20-500 W. FIG. 1E shows a cross-sectional view of the gate pattern after the over-etching step, and the gate electrode pattern is completed as shown by numeral 12'''.

Figure 2:
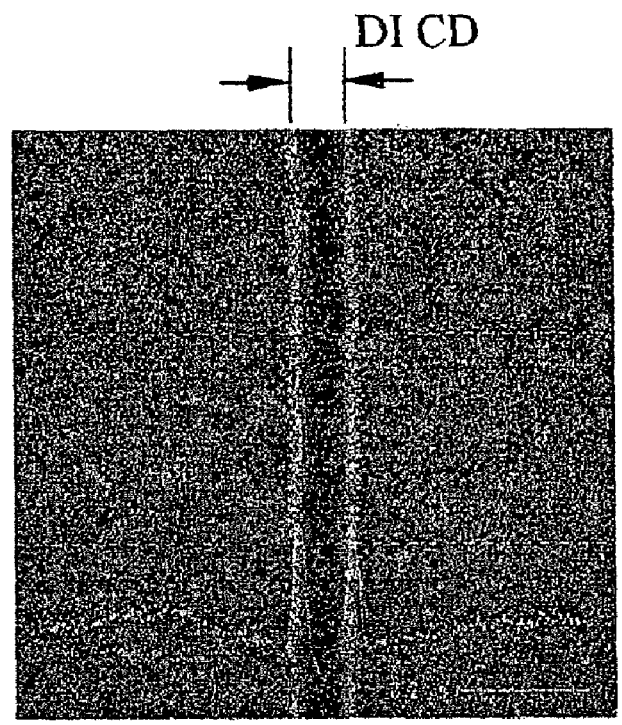
FIG. 2 is a picture showing a photoresist pattern before an etching process of a gate pattern.
Figure 3:
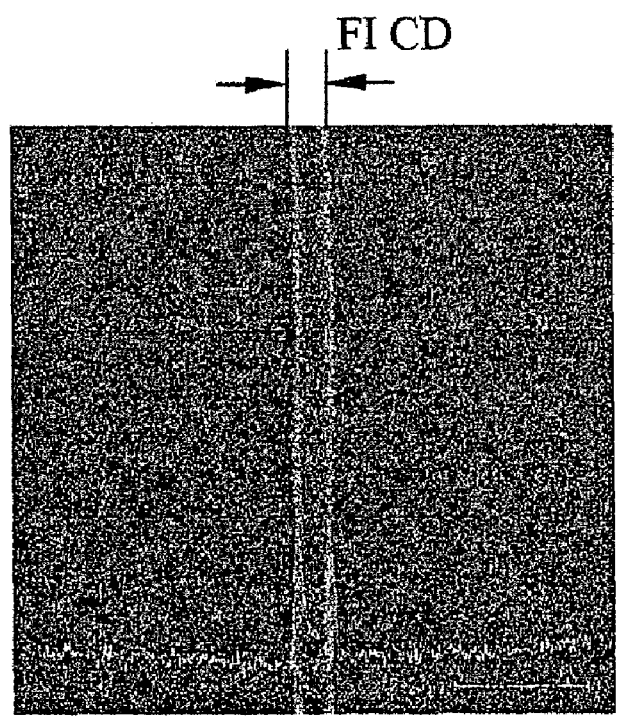
FIG. 3 is a picture showing a gate pattern after an etching process is completed.

FIG. 2 is a picture showing a develop inspection critical dimension (DICD) of the gate pattern prior to the overetching step, and the measurement is 102.5 nm. However, referring to FIG. 3, a final inspection critical dimension (FICD) of the gate pattern shows the measurement is 61.0 nm.

As described above, according to an exemplary embodiment of the present invention, a difference between the DICD and the FICD of the gate pattern may be adjusted or reduced by up to 30-40 nm (or up to about 30-40%) so that a gate pattern having a DICD of 60-70 nm can be formed using a photoresist pattern having a FICD of 100-110 nm.

Therefore, even if a DICD of a gate pattern is over 100 nm, a gate pattern of which the FICD is 60-70 nm can be formed. As a result, process margins in a corresponding photolithography process may be increased so that pattern failures can be decreased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gate pattern in a semiconductor device, comprising:
a semiconductor wafer;
a gate oxide layer on the semiconductor wafer;
an overetched gate electrode pattern on the gate oxide layer;
an anti-reflection coating pattern on the gate electrode layer; and
an ArF photoresist pattern on the anti-reflection coating pattern, coextensive with the anti-reflection coating pattern.

2. The gate pattern of claim 1, wherein the gate pattern has a critical dimension of 60-70 nm.

3. The gate pattern of claim 2, wherein the photoresist pattern has a critical dimension of 100-110 nm.

4. The gate pattern of claim 1, wherein the gate oxide layer has a thickness of 10-20 Å, the gate electrode pattern has a thickness of 1500-1800 Å, the anti-reflection coating pattern has a thickness of 300-400 Å, and the ArF photoresist pattern has a thickness of 2000-2700 Å.

5. A method of forming a gate pattern in a semiconductor device, comprising:
sequentially forming a gate oxide layer, a gate electrode layer, an anti-reflection coating layer, and an ArF photoresist layer on a semiconductor wafer;
forming a photoresist pattern by exposing and developing the ArF photoresist layer;
etching the anti-reflection coating layer using the photoresist pattern as an etching mask;
removing an oxide layer formed during etching of the anti-reflection coating layer;
etching the gate electrode layer; and
over-etching a remaining gate electrode layer.

6. The method of claim 5, wherein a critical dimension of the photoresist pattern before etching is 100-110 nm.

7. The method of claim 5, wherein etching the anti-reflection coating layer, removing the oxide layer, etching the gate electrode layer, and over-etching a remaining gate electrode layer each comprise etching with an inductively coupled plasma (ICP).

8. The method of claim 5, wherein the gate oxide layer has a thickness of 10-20 Å.

9. The method of claim 5, wherein the gate electrode layer has a thickness of 1500-1800 Å.

10. The method of claim 5, wherein the anti-reflection coating layer has a thickness of 300-400 Å.

11. The method of claim 5, wherein the ArF photoresist layer has a thickness of 2000-2700 Å.

12. The method of claim 5, wherein the gate oxide layer has a thickness of 10-20 Å, the gate electrode layer has a thickness of 1500-1800 Å, the anti-reflection coating layer has a thickness of 300-400 Å, and the ArF photoresist layer has a thickness of 2000-2700 Å.

13. The method of claim 7, wherein etching the anti-reflection coating layer further comprises flowing an etching gas comprising a fluorocarbon and an oxygen source at a rate of 80-130 sccm, and maintaining a chamber pressure of 0.5-25 mTorr, a source power of 100-1000 W, and a bias power of 5-100 W; and the method further comprises:
detecting an end-point of etching the anti-reflection coating layer; and
over-etching the remaining anti-reflection coating layer.

14. The method of claim 7, wherein etching the anti-reflection coating layer further comprises flowing an etching gas comprising $CF_4$ and $O_2$ at a rate of from 80 to 130 sccm, maintaining a pressure of an etching chamber at a level of 1-10 mTorr, maintaining a source power at 200-500 W, and maintaining a bias power at 10-70 W, and the method further comprises an additional over-etching process, performed after detecting an end-point of the etching.

15. The method of claim 7, wherein removing the oxide layer further comprises etching with a gas comprising a fluorocarbon having a flow rate of 20-100 sccm, for a time of 2-20 sec, and at a pressure of 0.5-10 mTorr, a source power of 100-1000 W, and a bias power of 10-100 W.

16. The method of claim 7, wherein removing the oxide layer comprises etching with a gas comprising $CF_4$ flowed at a rate of 40-60 sccm, for a process time of 5-10 sec, a pressure of 1-7 mTorr, a source power of 300-700 W, and a bias power of 20-70 W.

17. The method of claim 7, wherein etching the gate electrode layer comprises etching with a gas comprising a chlorine source, a hydrogen halide and (optionally) an oxygen source having a total flow rate of 100-250 sccm, for a time of 10-100 sec, and at a chamber pressure of 0.5-10 mTorr, a source power of 200-1000 W, and a bias power of 20-200 W.

18. The method of claim 7, wherein etching the gate electrode layer comprises etching with a gas comprising $Cl_2$ flowed at a rate of 10-50 sccm, HBr flowed at a rate of 100-180 sccm, and $O_2$ flowed at a rate of 0-5 sccm, for a process time of 30-50 sec, and at a chamber pressure of 1-7 mTorr, a source power of 300-800 W, and a bias power of 50-100 W.

19. The method of claim 7, wherein over-etching the remaining gate electrode layer comprises etching with a gas comprising a nitrogen source, a hydrogen halide and an oxygen source having a flow rate of 100-250 sccm, for a time of 60-240 sec, and at a pressure of 10-150 mTorr, a source power of 500-2500 W, and a bias power of 20-500 W.

20. The method of claim 7, wherein over-etching the remaining gate electrode layer comprises etching with a gas comprising $N_2$ flowed at a rate of 5-15 sccm, HBr flowed at a rate of 130-170 sccm, and $O_2$ flowed at a rate of 1-5 sccm, for a process time of 100-140 sec, and at an etching chamber pressure of 50-100 mTorr, a source power of 700-1500 W, and a bias power of 50-200 W.

* * * * *